US005479134A

United States Patent [19]
Nishioka et al.

[11] Patent Number: 5,479,134
[45] Date of Patent: Dec. 26, 1995

[54] POWER AMPLIFIER CIRCUIT FOR AUDIO SIGNAL AND AUDIO DEVICE USING THE SAME

[75] Inventors: Kei Nishioka; Masanori Fujisawa; Katsumi Kusaba, all of Kyoto, Japan

[73] Assignee: Rohm Co., Ltd., Kyoto, Japan

[21] Appl. No.: 308,457

[22] Filed: Sep. 19, 1994

[30] Foreign Application Priority Data

Sep. 20, 1993 [JP] Japan ................................ 5-256498
Sep. 20, 1993 [JP] Japan ................................ 5-256499
Oct. 4, 1993 [JP] Japan ................................ 5-271256

[51] Int. Cl.⁶ .................................................. H03F 3/30
[52] U.S. Cl. ............................ 330/273; 330/146; 330/297
[58] Field of Search ................................ 330/146, 202, 330/267, 273, 297

[56] References Cited

U.S. PATENT DOCUMENTS

| 3,585,517 | 6/1971 | Herbert | 330/297 X |
| 4,218,660 | 8/1980 | Carver | 330/297 |
| 5,075,634 | 12/1991 | French | 330/297 |

OTHER PUBLICATIONS

U.S. Ser. No. 8/199,890 filed Feb. 22, 1994 to Nishioka et al.
U.S. Ser. No. 08/203,307 filed Mar. 1, 1994 to Nishioka et al.

*Primary Examiner*—James B. Mullins
*Attorney, Agent, or Firm*—Fay, Sharpe, Beall, Fagan, Minnich & McKee

[57] ABSTRACT

The present invention includes a first push-pull amplifier for amplifying an audio signal, a second push-pull amplifier for inverting and amplifying the audio signal, a switching circuit for switching power from a power source line at a frequency exceeding an audible frequency and feeding the first or second amplifier, a control circuit for controlling a switching period of the switching circuit such that the feeding power is changed correspondingly to a level of the audio signal correspondingly to a first difference in voltage between one of the audio signal and the audio signal amplified by the amplifier and the power or a second difference in voltage between one of the audio signal and the audio signal amplified by the second amplifier and the feeding power and a capacitor provided between the outputs of the first and second amplifiers, a loud speaker being driven by outputs of the first and second amplifiers.

17 Claims, 12 Drawing Sheets

BLOCK DIAGRAM

WAVEFORM

POWER AMPLIFIER CIRCUIT FOR AUDIO SIGNAL AND AUDIO DEVICE USING THE SAME

DESCRIPTION

1. Technical Field

The present invention relates to a power amplifier circuit for an audio signal and an audio device using the same and, particularly, to a power amplifier circuit capable of reducing power consumption in a Balanced Transformer Less (BTL) type output circuit of an audio device, particularly, a portable audio device, such as a radio receiver, a cassette tape recorder, video tape recorder, a video camera and a component stereo device, which amplifies an audio signal such as voice or musical sound and outputs a sound by driving a loud speaker by the BTL output circuit.

2. Background Art

FIG. 12(a) shows a schematic block circuit diagram of a conventional portable cassette tape player as an example of the BTL output circuit. Numeral 1 depicts a read head, 2 a signal reproduction processing circuit including a head amplifier and an equalizer circuit, etc., 3 an output stage amplifier of positive phase side (non-inverted output side), 4 a loud speaker as a load and 5 an output stage amplifier of inverted phase side (inverted output side).

During reproduction, the audio signal recorded on a tape (not shown) is read out therefrom through the read head 1 as a read signal A which is an input audio signal. The read signal A is input to the signal reproduction processing circuit 2 in which a high frequency bias component thereof during recording is removed and, after equalization processing, output as an audio signal B. The thus reproduced audio signal B is finally amplified by the output stage amplifiers 3 and 5 in which output signals C and C' are produced and the loud speaker 4 is driven by these outputs. As a result, a reproduced sound is generated by the loud speaker 4.

It is usual that the transistor amplifiers 3 and 5 include in their input stages input stage amplifiers 3a and 5a for producing a pair of signals. The audio signal B is amplified by the input stage amplifier 3a and made a pair of signals whose phases are different from each other by 180°. These signals are amplified by push-pull transistors Q1 and Q2 which constitute an output stage amplifier to power amplify as an output signal C. The audio signal B is inverted and amplified by the input stage amplifier 5a, amplified similarly by push-pull transistors Q3 and Q4 and power-amplified as the output signal C'.

Describing the power amplification in the output stage amplifier 3 as an example, a voltage of a power line Vcc which feeds the output stage amplifier 3 in accordance to the input signal B is lowered by the transistor Q1 to a voltage level of the output signal C. In other words, the output signal C is produced as a result that an amount of voltage drop by an internal impedance of the transistor Q1 is changed according to a waveform of the audio signal B. In this case, the transistor Q1 handles a voltage difference between the line voltage Vcc and the voltage of the output signal C. As a result, the transistor Q1 consumes a power corresponding to the voltage difference.

Although the output stage amplifier is shown in the figure as comprising a simple circuit including the output transistors Q1 and Q2, a peripheral circuit including a drive circuit, etc., may be included in a practical circuit construction. The above matter is the same for the output stage amplifier 5. Particularly, in the case of the BTL circuit, although the input stage amplifiers 3a and 5a are constructed by differential amplifiers and negative feedback is provided from output terminals of the amplifiers 3 and 5 to the inverted input sides of the input differential amplifiers 3a and 5a to which a reference voltage (corresponding to Vcc/2 where Vcc is a power source voltage) is supplied, such is omitted in the figure since it has no direct relation to the present invention.

Describing the operation of the BTL output stage amplifiers 3 and 5 in detail, when a voltage value of the audio signal B is higher than the reference voltage (Vcc/2), the transistor Q1 on the side of the power source is made active by the output of the input stage amplifier 3a and the transistor Q2 on the ground side is cut off. Further, the transistor Q3 on the side of the power source is cut off and the transistor Q4 on the ground side is made active by the output of the input stage amplifier 5a. And, current corresponding to the voltage value of the audio signal B flows from the power source line Vcc through the transistor Q1, the loud speaker 4 and the transistor Q4 to the ground.

When the voltage value of the audio signal B is lower than the reference voltage, the ON and OFF operations of the transistors are reversed to those mentioned above and current corresponding to the voltage value of the audio signal B flows from the power source line Vcc through the transistor Q3, the loud speaker 4 and the transistor Q2 to the ground.

When the voltage value of the audio signal B is equal to the reference voltage, the respective transistors are in OFF state. In this case, due to the negative feedback to the input stage amplifiers 3a and 5a, output terminals of the amplifiers 3 and 5 become Vcc/2, respectively.

Power consumed by the respective transistors Q1, Q2, Q3 and Q4 when the pair of output stage amplifiers 3 and 5 which operate in reverse phase to each other are provided and are operated in BTL operation in this manner is shown by hatching in FIG. 12(b). In this figure, power consumption of these transistors are shown by areas hatched with lines in different directions.

Power caused by the voltage drop of the output transistors shown by hatching is dissipated by the power amplifier transistor as heat. Therefore, transistors whose power loss is large are required. Since a large power is consumed there, power efficiency in a case of production of the output signals C and C' by the BTL circuit is low.

This fact is a problem in a portable audio device which is operated by a battery of limited capacity since an operating time thereof depends upon utilization efficiency of power. Further, for such device, it is very important, as a commercial product, that it is operable for a long period of time. Therefore, power consumption of the device should be as small as possible.

U.S Ser. Nos. 08/199,890 and 08/203,307 disclose such techniques as mentioned above.

SUMMARY OF THE INVENTION

An object of the present invention is to provide a BTL power amplifier circuit for audio signal, which is capable of reducing power consumption of an output circuit thereof.

Another object of the present invention is to provide a power amplifier circuit for audio signal, which can use transistors whose power loss is small by reduction of power consumption of the transistors of the output circuit thereof.

A further object of the present invention is to provide an audio device capable of reducing power consumption of an output circuit thereof.

A still further object of the present invention is to provide an audio device which is suitable as a portable device.

A power amplifier circuit for audio signal and an audio device using the same according to the present invention, which achieve the above objects, are accomplished by providing a first push-pull amplifier for amplifying an audio signal, a second push-pull amplifier for inverting and amplifying the audio signal, a switching circuit responsive to a frequency exceeding audible frequency for supplying a power from a power line to the first or second amplifiers, a control circuit for controlling a switching period of the switching circuit such that a power supplied in accordance to one of a first voltage difference between a power line voltage and either one of a voltage of the audio signal and a voltage of an amplified audio signal obtained by amplifying the audio signal by the amplifier and a second voltage difference between the power line voltage and either one of the voltage of the audio signal and a voltage of an amplified audio signal obtained by amplifying the audio signal by the second amplifier is changed correspondingly to a level of the audio signal and a capacitor provided between an output of the first amplifier and an output of the second amplifier, and wherein outputs of the first amplifier and the second amplifier drive the loud speaker.

By providing such control circuit and such switching circuit between the first or second amplifiers and the power line, the power to be supplied to the amplifiers is generated by a switching control. Further, the voltage of the power supplied to the amplifiers is fedback correspondingly to the voltage of the audio signal. Therefore, it is possible to keep the voltage difference between the voltages of the supplied power and the output signal of the amplifier constant. Thus, it is possible to keep the constant voltage difference at a minimum voltage necessary for the operation of the amplifier or at a constant value within a low voltage range if it is not the minimum voltage.

The constant voltage difference (constant voltage) corresponds, in the amplifier, to a voltage drop for generating the output signal. Therefore, in this case, the amplification is performed while the voltage drop in the amplifiers is kept at the minimum voltage or at the constant low voltage. A current value of the output signal in this case is determined by the power supplied from the switching circuit and corresponds to the input audio signal. Further, power consumption of the amplifier in this case is substantially determined by the above mentioned constant voltage. Therefore, the power consumption becomes smaller compared with that when an output signal is obtained by a direct voltage drop from the constant supply voltage as in the conventional system.

On the other hand, a total power loss of the switching circuit and the control circuit, for switching the source line voltage Vcc, is mainly generated transiently only at switching time since an ON resistance of a switching transistor thereof is low. The power loss is very minor compared with the conventional system in which such loss is always generated. An increase of power consumption due to this is relatively small compared with power consumption in the power amplifier stage.

Further, by the provision of the capacitor in parallel to the loudspeaker, the current flowing through the loudspeaker can be smoothed and intensified without increasing power consumption.

Therefore, it is possible to reduce power loss consumed by amplification of audio signal as a whole. For this reason, it is possible to improve the power utilization efficiency.

In the present invention, the switching of the power supply line is performed at a timing exceeding an audible frequency. Therefore, even if a distortion component caused by switching operation is included in the amplified audio signal, that component is hardly heard finally. Therefore, the quality of audio signal is not degraded practically and the performance as an audio device can be maintained.

DESCRIPTION OF THE PREFERRED EMBODIMENTS

Figure 1:
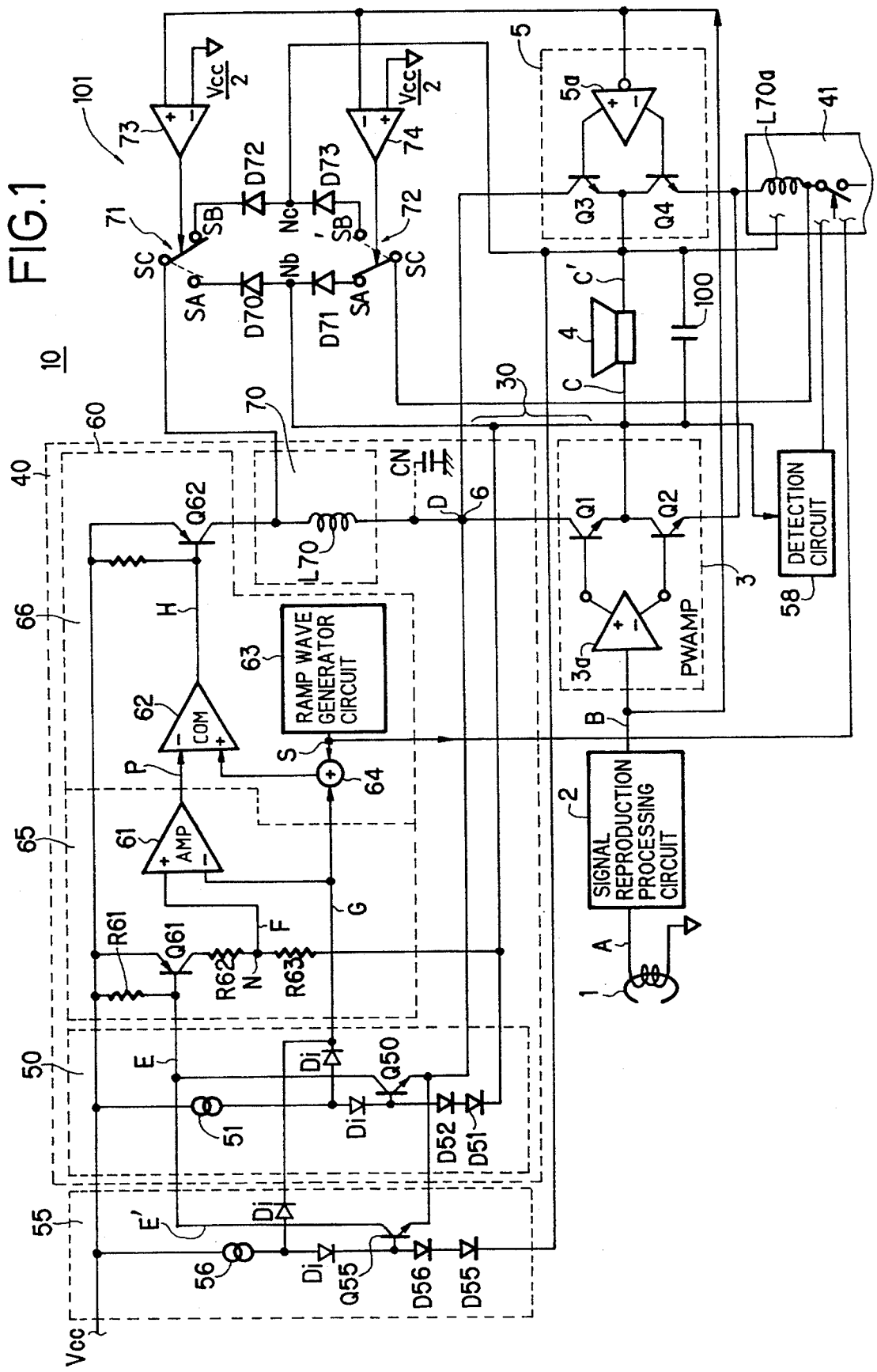
FIG. 1 is a block diagram of an audio device according to an embodiment of the present invention when applied to a portable cassette tape player.
Figure 12A:
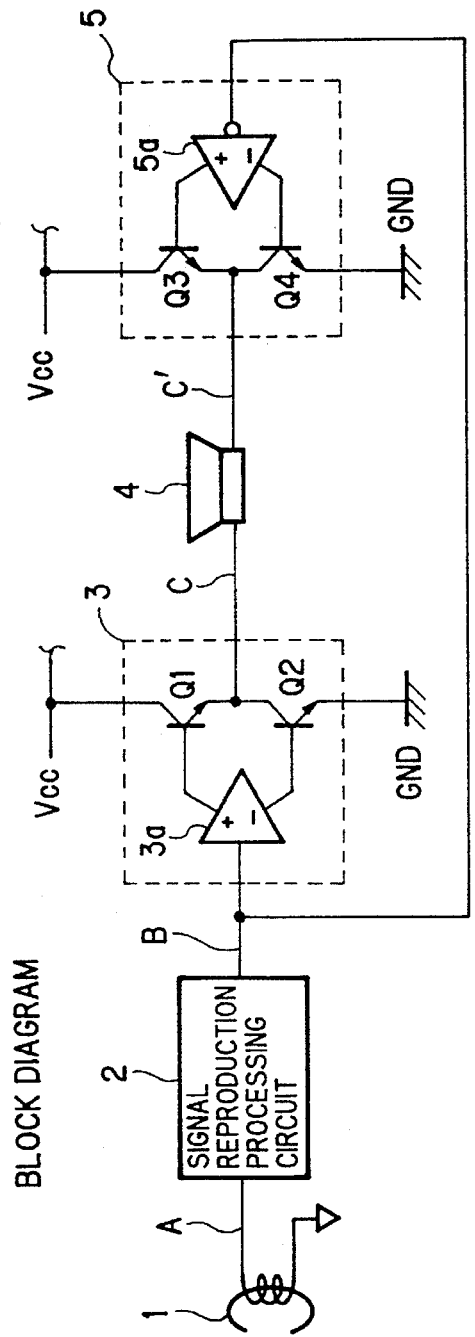
FIG. 12(a) and 12(b) are a block diagram of a portable cassette tape player using a conventional BTL output circuit and an illustration for explanation of power consumption of its output stage transistor, respectively.
Figure 12B:
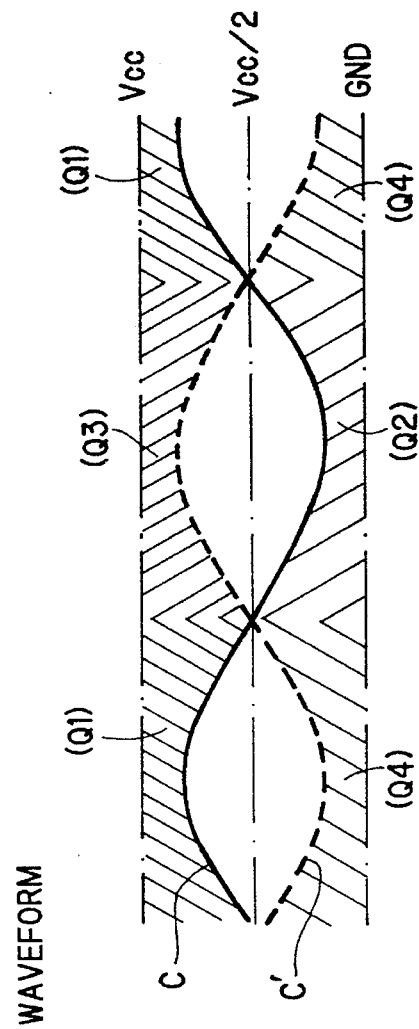

In FIG. 1, an output stage circuit 30 is an output stage amplifier circuit of a portable cassette tape player 10 in which supply power control circuits 40 and 41 for supplying power to the amplifiers 3 and 5 shown in FIG. 12 are provided on the sides of a power source and ground, respectively. Although a negative feedback is provided to inverted inputs of the input stage amplifiers 3a and 5a, they are omitted in the figure. Further, the same constructions as those in FIG. 12 are depicted by same reference numerals, respectively. Therefore, detailed descriptions thereof are omitted. Although not shown, a supply line Vcc is connected to a +side output voltage line of a battery as a portable audio device.

The supply power control circuit 40 is a power control circuit which regulates an output power under control of pulse width modulation (PWM) such that voltage of the output power is maintained at a constant value with respect to an output signal of an audio signal. A supply current control is performed correspondingly to a variation of internal impedance of output transistors Q1 and Q3 which is determined corresponding to a signal level of a positive or negative half cycle of an audio signal. In order to do this, a voltage of the output voltage and voltages of output signals C and C' are detected. Also, a power corresponding to a difference therebetween is supplied to the transistors Q1 and Q3 and a control is performed such that a potential difference between an output side of the transistors Q1 and Q3 and a power supply terminal becomes constant. By doing this, a power corresponding to the input signal (or output signal) is supplied simultaneously.

This circuit 40 is composed of a detection circuit 50, a switching regulation circuit 60 and a smoothing circuit 70. A capacitor CN depicted by a dotted line is for by-passing high frequency signal and has a capacitance of in the order of 2000P. This capacitor is theoretically unnecessary.

The switching regulation circuit 60 is a circuit inserted in between the power source line Vcc and a power supply terminal (output terminal 6). This is composed of a control voltage value generating circuit 65 and a switching circuit 66. The control voltage value generating circuit 65 has a transistor Q61 and an amplifier 61 and generates a control voltage value for the switching control. The switching circuit 66 includes a comparator 62, a switching PNP transistor Q62 and a ramp wave generator circuit 63, ON/OFF controls the power supply line connected to the power source line Vcc by the transistor Q62 and sends a resultant power to the output terminal 6 through the smoothing circuit 70. This becomes a supply power D for the amplifier 3 which is generated at the output terminal 6.

Under control of the supply power control circuit 40, the voltage at the output terminal 6 is changed according to the level of the output signal C. However, since the potential difference between the output terminal 6 and the output terminal of the output signal of the transistor Q1 is maintained constant, power consumption in the transistor Q1 is reduced as mentioned previously. That is, in this case, when the signal level of the output signal C is low, the voltage at the output terminal 6 becomes low correspondingly. When the signal level of the output signal C is high, the voltage at the output terminal 6 becomes high correspondingly.

A total power consumption of the supply power control circuit 40 and the transistor Q1 must be smaller than that consumed by the conventional transistor Q1. This can be achieved by selecting high frequency as the switching frequency, for example, making it as high as 50 kHz to 800 kHz, and by maintaining the potential difference between the output terminal 6 and the output terminal of the output signal of the transistor Q1 at a constant voltage lower than an average voltage drop from the conventional power source line Vcc. By this, it is restricted to a smaller value than an average power consumption generated by a voltage drop from the power source voltage Vcc in the conventional transistor Q1.

As mentioned previously, the amplifier 3 push-pull amplifies the audio signal B by the transistors Q1 and Q2 to perform a power amplification and generates the amplified output signal C.

The detection circuit 50 is constituted mainly with an NPN transistor Q50 having a detection terminal provided between a base and emitter thereof. Its detection signal E is supplied to the transistor Q61 of the switching regulation circuit 60 to ON/OFF switch the transistor Q62. The transistor Q50 receives at its emitter a voltage of the supply power D and at a base a voltage of the output signal C output from the amplifier 3 through forward-connected diodes D51 and D52. As a result, a detecting operation of the detection circuit 50 depends upon whether or not a voltage difference VD-C between the voltage of the supply power D and the voltage of the output signal C is larger than 1 Vf (base-emitter forward drop voltage).

The detection circuit 55 is similar to the detection circuit 50 and provided on the side of the transistor Q3. Its detection signal is wired-ORed with the detection signal of the detection circuit 50 through the wired-ORed and level shifting diodes Di. The output terminal 6 of the supply power control circuit 40 is also connected to collectors of the transistors Q1 and Q3. Further, the output transistors Q1 and Q3 of the BTL are operated alternately in the upper half cycle and the lower half cycle of the audio signal B, respectively, so that they are not operated simultaneously. Thus, the supply power control circuit 40 operates to supply power for operation of the transistor Q3 like the transistor Q1.

Therefore, the operation of the transistor Q1 and the operation of the detection circuit 50 will be described mainly hereinafter.

Now, when this voltage difference VD-C is not larger than 1 Vf, the transistor Q50 of the detection circuit 50 is turned ON. By this, a current corresponding to the detection signal E (=error voltage) of the voltage difference 1 Vf-VD-C is supplied to the transistor Q61. The transistor Q61 generates a voltage which is amplified correspondingly to this error voltage as a voltage-divided voltage F (to be described later). On the other hand, when the voltage difference VD-C is larger than 1Vf, the transistor Q50 is turned OFF. By this, a detection signal E of constant voltage (=Vcc) is generated. Incidentally, 51 is a constant current source for maintaining the diodes D51 and D52 in ON state and generates a reference signal G which is high than the output voltage C by 2×1 Vf (=2 Vf) at a base of the transistor Q50.

The control voltage value generating circuit 65 responds to the detection signal E to generate a comparison voltage value P for the comparator 62. This generates a voltage value between the voltage of the power source line Vcc and the voltage of the output signal C at a junction N between series connected resistor circuits R62 and R63 as the voltage-divided voltage F when the transistor Q61 is turned On in response to the detection signal E from the detection circuit 50, in other words, when the voltage difference between the voltage of the output signal C and the voltage of the supply power D becomes not larger than 1 Vf.

The amplifier 61 responds to this voltage-divided voltage F to generate the above mentioned comparison voltage value P by amplifying a difference signal between that and the voltage of the reference signal G. And, it outputs that to a (−) input (on the side of a reference terminal) of the comparator 62.

When the transistor Q61 is turned OFF in response to a reception of the detection signal E from the detection circuit 50, that is, when the voltage difference between the voltage of the output signal C and the voltage of the supply power D of the output terminal 6 becomes larger than 1 Vf, the comparison voltage value P is generated by the amplification of the voltage difference (=2 Vf) between the output signal C and the reference signal G by means of the amplifier 61. This becomes a constant value (as will described later, lower than the signal level of the ramp wave).

The comparator 62 receives at its (+) input a ramp signal S having a constant frequency exceeding audible frequency from the ramp wave generator circuit 63. And, it compares the voltage of the comparator voltage value P with the voltage of the signal S and outputs a HIGH level signal by which the PNP transistor Q62 is turned OFF as a drive pulse H when the voltage of the signal S exceeds the voltage of the comparison voltage value P. This drive pulse H is supplied to the transistor Q62. It should be noted that the ramp signal S is based on the voltage of the reference signal G having amplitude reference corresponding to the amplitude variation of the audio signal B and the reference signal G and the signal S are synthesized in a synthesizer circuit 64 before it is input to the comparator 62.

The smoothing circuit 70 is connected to an output of the transistor Q62 of the switching circuit 66 and smooths its output power. This circuit includes mainly a coil L70 inserted in series into between the output of the transistor Q62 and the power supply line (output terminal 6) to the amplifier 3. With the coil L70, power switched is smoothed, resulting in a smoothed supply power D at the output terminal 6. A flywheel diode (to be described later) is connected between an input terminal of the coil L70 and outputs of the amplifiers 3 and 5. By this diode, a circular path for a current flowing through the coil L70 is formed. By this, energy stored in the coil L70 when the power supply line is blocked by the switching transistor Q62 is supplied to the side of the amplifiers 3 and 5 as an inertia current and returned to the coil L70.

Next, an operation of the switching regulation circuit 60 for controlling the voltage difference VD-C between the supply power D and the output signal C to substantially 1 Vf will be described.

Figure 2:
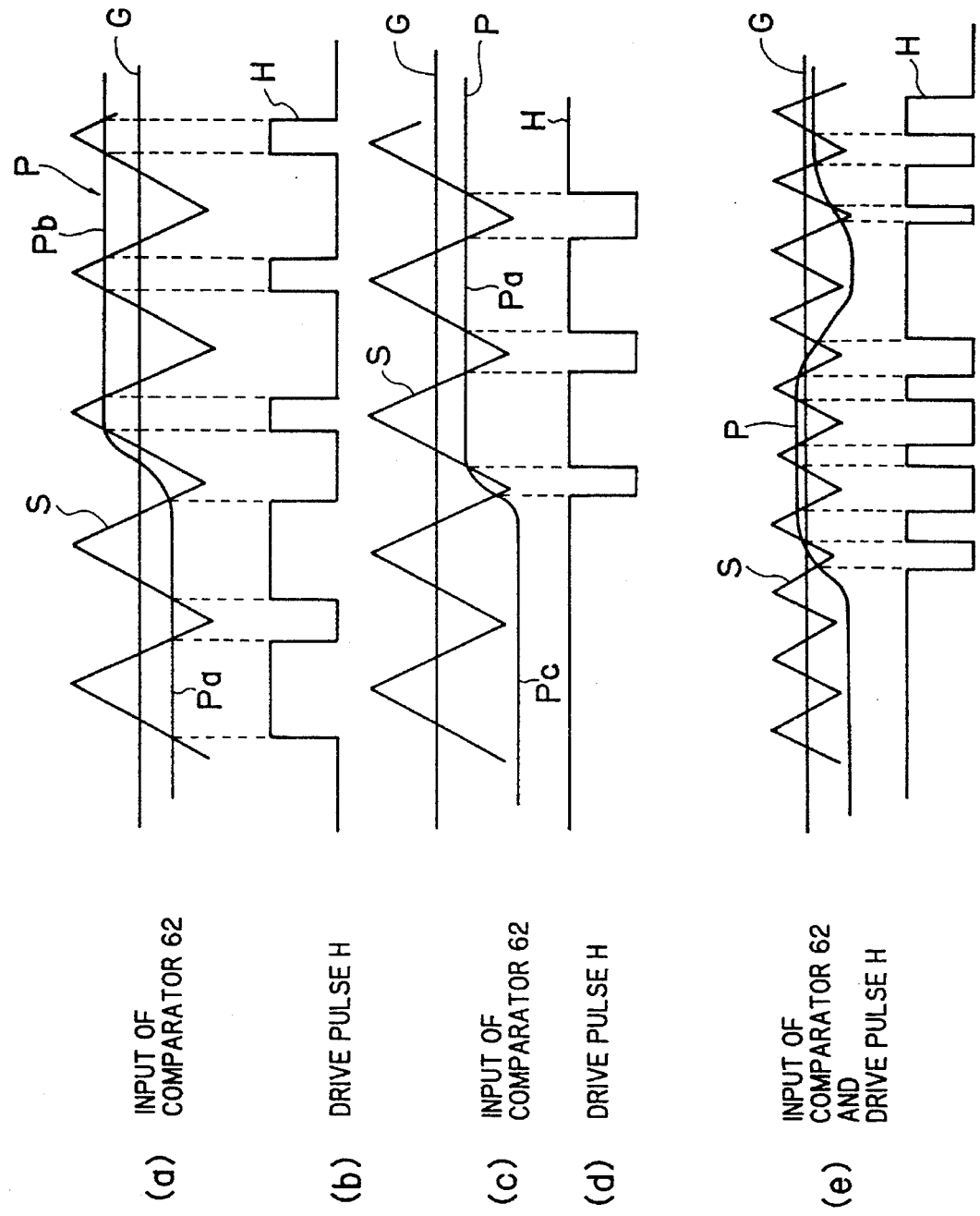
FIG. 2 shows waveforms for explaining an operation of a supply power control circuit in FIG. 1.

As shown in FIG. 2, the comparator 62 receives at one input the ramp signal S (see FIGS. 2(a) and 2(b)) having the reference signal G as a reference and at the other input the comparison voltage value P.

When the voltage difference VD-C is not larger than 1 Vf, as shown in FIG. 2(a), the comparator 62 generates a binary drive pulse H (see H in FIG. 2(b)) corresponding to a result of comparison in level between the ramp signal level (waveform S) and the output signal (waveform P) of the amplifier 61, with which the transistor Q62 is ON/OFFed. In this case, the level Pa of a forward half of the signal P is lower than the reference signal G. This corresponds to a state where the voltage difference VD-C is maintained at slightly lower than 1 Vf but substantially equal to 1 Vf. The level Pb of a rearward half of the signal P is higher than the reference signal G. In this case, the voltage difference VD-C is lower than 1 Vf. In this case, a time period of the drive pulse H for which the latter is in HIGH level is short so that an amount of supply power D is increased. By doing this, it is controlled such that the supply power D is increased to increase its voltage to thereby make the voltage difference VD-C become substantially 1 Vf.

Thus, when the voltage difference VD-C is not larger than 1 Vf, the level of the comparison voltage value P is changed in a direction in which the difference is made substantially equal to 1 Vf and a current corresponding thereto is supplied to the amplifier 3. And, the voltage difference VD-C becomes substantially 1 Vf. That is, the PWM is performed correspondingly to a result of comparison between the comparison voltage value P and the ramp wave S and the switching transistor Q62 is ON/OFF controlled by the drive pulse H. Such control is performed correspondingly to the value of the detection signal E.

When the difference between the voltage of the output signal C and the voltage of the supply power D is larger than 1 Vf, the transistor Q50 is turned OFF. In this case, the detection voltage E becomes the source voltage Vcc. Therefore, the transistor Q61 is turned OFF, generating the voltage difference 2 Vf. As a result, the comparison voltage value P becomes a level Pc shown in FIG. 2(c) and a constant voltage which is lower than the reference signal G by 2 Vf is supplied to the comparator 62. As a result, a drive pulse H such as shown by a high level waveform H in FIG. 2(d) is generated to turn OFF the transistor Q62 of the switching. As a result, the power supply is performed to the amplifier 3 such that the voltage difference VD-C becomes substantially 1 Vf and the comparison voltage value P is returned to the level Pa.

The above mentioned level Pa of the comparison voltage value P is determined by values of the resistors R62 and R63 and is selectable. Further, the above mentioned level Pc of the comparison voltage value P is determined in relation to an amplitude of the ramp wave and this is also selectable. Further, a response speed to a change of the level of the comparison voltage value P is high enough against a change of the audio signal and is selectable in designing the circuit.

As a concrete operation, for example, when the voltage level of the input signal B is decreased largely, the internal impedance of the transistor Q1 is abruptly raised and the voltage difference between the voltage of the output signal C and the voltage of the supply power D of the output terminal 6 becomes higher than 1 Vf. In this case, the comparison voltage value P becomes lower in level than the ramp wave S as shown by Pc and the drive pulse H of the comparator 62 is maintained in HIGH level to maintain the transistor Q62 in OFF state. Such control is performed continuously until the voltage difference between the output signal C and the voltage of the supply power D of the output terminal 6 becomes near 1 Vf.

For example, when the voltage level of the input signal B is raised considerably, the internal impedance of the transistor Q1 is lowered abruptly and the voltage difference between the output signal C and the voltage of the supply power D of the output terminal 6 becomes lower than 1 Vf. In such case, the comparison voltage value Pb corresponding to an error reducing 1 Vf is supplied. By doing this, the control is performed such that the voltage of the supply power D is raised to make an aimed value of the voltage difference equal to 1 Vf.

For a gentle change of the level of the input signal B, the two controls for the case where it is equal to or lower than 1 Vf and for the case where it is not higher than 1 Vf are performed alternatively for short time correspondingly to change of internal impedance of the transistor Q1, resulting in alternating pulses including pulses having width covering a plurality of cycles of the ramp signal S and pulses having shorter width, as shown in FIG. 2(e).

Frequency of the ramp wave is preferably within a range 100 kHz to 500 KHz in view of the fact that an upper limit of audible frequency is generally 20 KHz and in view of ease of regulation of an oscillator circuit and power efficiency.

In this case, 1 Vf (about 0.7 V) of the voltage difference VD-C which is the aimed value of control (a predetermined detection reference voltage for voltage difference) is a value determined in correspondence to the fact that the transistor Q1 of the amplifier 3 is a single state transistor. That is, the voltage difference VD-C between the voltage of the supply power D to the amplifier 3 and the voltage of the output signal C of the amplifier 3 is selected from values which do not degrade the response performance of the transistor Q1 as a value which is as close as possible to a collector—emitter voltage which is the minimum necessary to allow the amplifier 3 to perform its amplification operation. Therefore, if the transistor Q1 is composed of Darlington-connected transistors, the above mentioned voltage difference VD-C is made 2 Vf (about 1.4 V). In detail, another diode is further connected to the diodes D51 and D52.

Describing the operation of the detection circuit 55, this circuit generates a detection signal E' having value corresponding to whether or not the voltage difference VD-C' between the voltage of the supply power D and the output signal voltage C' is larger than 1 Vf. The detection signal E' is wired-ORed with the detection signal E and supplied to the transistor Q61 of the switching regulation circuit 60.

By this, the PWM control in the switching regulation circuit 60 depends upon not only the voltage difference VD-C but also the voltage difference VD-C' on the side of the amplifier 5. However, since, when one of the transistors Q1 and Q3 is in the ON state, the other transistor is in the OFF state, there is no problem. Therefore, the operation of the detection circuit 55 is the same as that mentioned previously except that the object to be detected is the voltage difference VD-C' on the side of the amplifier 5.

Figure 3:
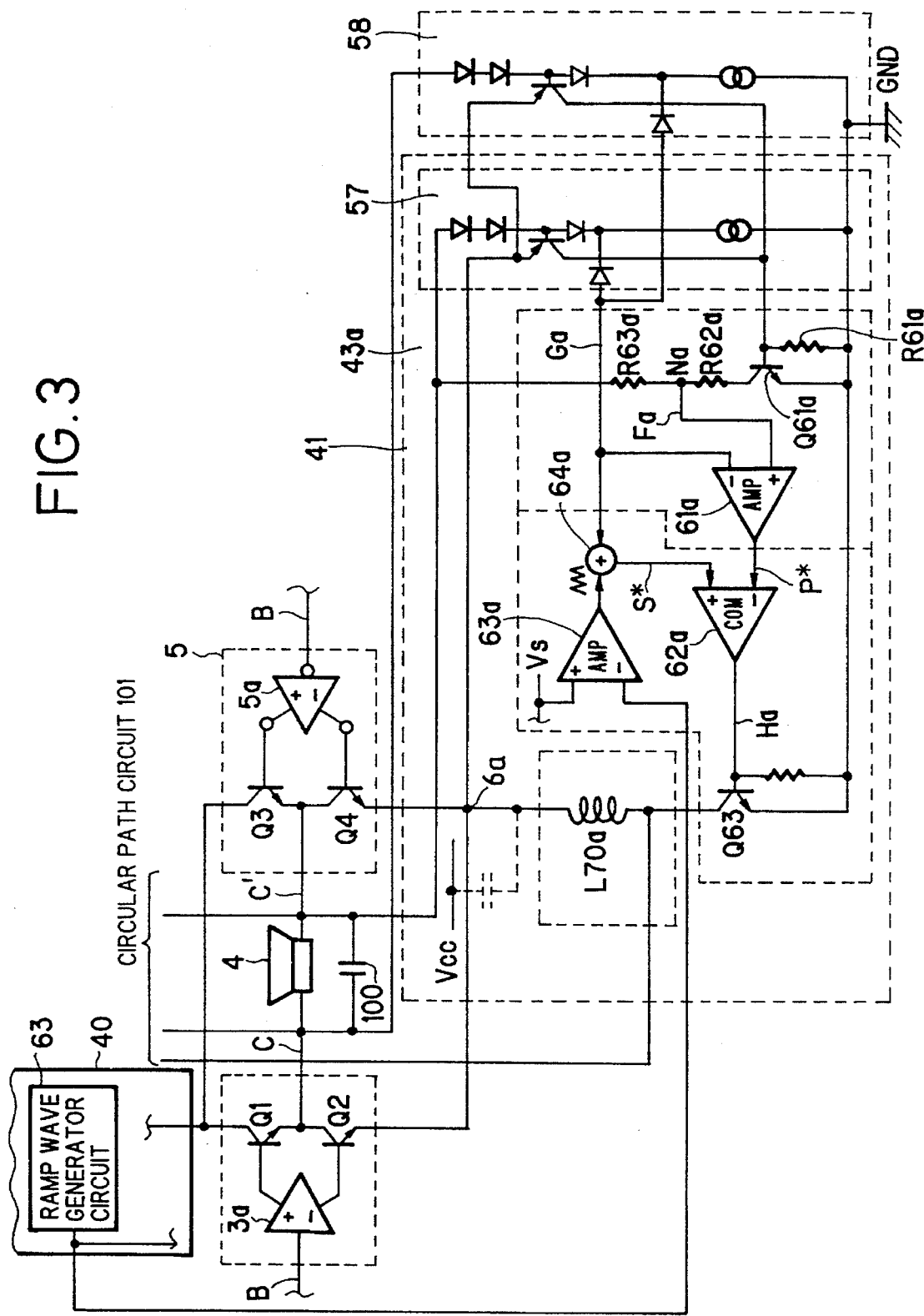
FIG. 3 is a block diagram of the supply power control circuit on the ground side in FIG. 1.

FIG. 3 shows the supply power control circuit 41 provided between the transistors Q2 and Q4 and the ground in detail.

The supply power control circuit 41 differs from the supply power control circuit 40 in that it includes as the ramp wave generator circuit an inverting amplifier 63a which responds to the output of the ramp wave generator circuit 63 on the side of the supply power control circuit 40 to generate a ramp wave having a phase different from the output of the ramp wave generator circuit 63 by 180 degrees and in that the power supply line Vcc and the ground line GND are exchanged. 57 is its detection circuit which corresponds to the detection circuit 50. The NPN transistor Q63 is a switching transistor and corresponds to the PNP transistor Q62. The amplifier 61a, the comparator 62a and the transistor Q61 correspond to the amplifier 61, the comparator 62 and the transistor 61a, respectively. And the input terminal 6a of the supply power control circuit 41 which receives current to be sunk from the respective amplifiers 3 and 5 to the ground GND corresponds to the output terminal 6 of the supply power control circuit 40 except that output current (its voltage is assumed as D') is changed to input current.

Figure 6:
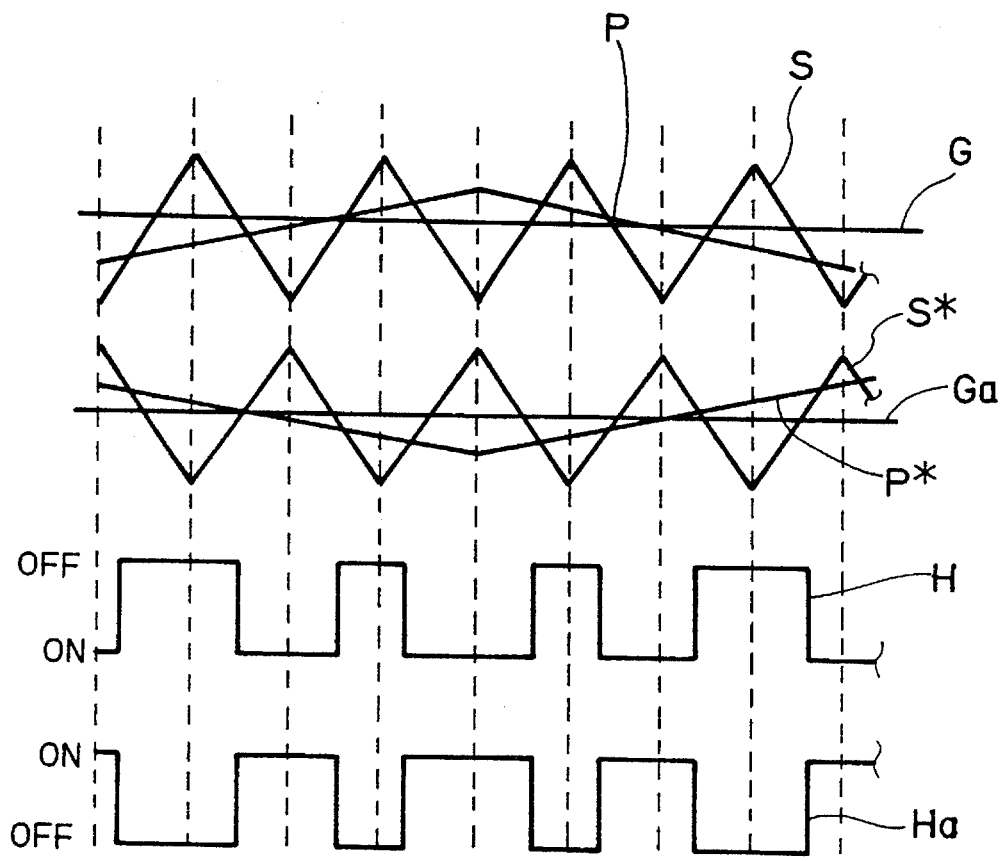
FIG. 6 shows waveforms for explanation of a switching operation of the supply power control circuits on both the power source side and the ground side.

The amplifier 61a receives at its (−) input a voltage signal which is lower than the voltage of the signal of the output C' of the transistors Q3 and Q4 by 2 Vf and at its (+) input a voltage Fa at a junction Na of the resistors R62a and R63a. Since the potential on the (−) input side is usually high, a detection signal P* which has a phase inverted with respect to the output signal P of the amplifier 61 is generated at the output of the amplifier 61a, as shown in FIG. 6. This is input to the (−) side of the comparator 62a.

The amplifier 63a receives an output S of the ramp wave generator circuit 63, generates a ramp wave signal having phase inverted with respect to the output of the ramp wave generator circuit 63 and supplies it to the combining circuit 64a. The combining circuit 64a combines the phase inverted signal with the reference signal Ga to make it to a ramp wave S* (see FIG. 6) having reference level equal to the reference signal Ga before it is supplied to the comparator 62a. Therefore, the ramp wave S* also has, as a reference, the voltage of the reference signal Ga whose amplitude reference changes correspondingly to amplitude variation of the audio signal B.

The comparator 62a receives at its (+) input the signal S* from the combining circuit 64a. It compares the signal S* with a comparison voltage value P, and, when the voltage of the signal S* is equal to or lower than the voltage of the comparison voltage value P*, generates a drive signal Ha of LOW level to turn the NPN transistor Q63 OFF.

When current which is larger than it is supplied, the drive pulses H and Ha are substantially synchronized with each other and generated at substantially the same timing, so that the ON/OFF switching regulation on both the power source and ground sides is substantially synchronized, resulting in a reduction of signal distortion.

Further, since, when the transistor Q63 is a PNP transistor, the ON/OFF relation is reversed, the ON/OFF switching is substantially synchronized with the switching regulator on the power source side without inverting the phase of the ramp wave by means of the amplifier 63a, if the connection of the input sides of the comparators 61a and 62a correspondingly to the operation of the detection system is exchanged. However, since, for the PNP transistor, the ON saturation voltage from the ground becomes high, power consumption of this transistor is increased.

On the other hand, the detection circuit 58 provided correspondingly on the side of the transistor Q2 is similar to the detection circuit 55 and connected in parallel to the detection circuit 57. Its operation is similar to that of the detection circuit 57.

Now, an operation of this tape player will be described.

During reproduction, the read signal A is obtained from a tape (not shown) on which the audio signal is recorded, through the read head 1. With respect to this read signal A, the audio signal B is obtained by the signal reproducing processing circuit 2. This audio signal B is push-pull amplified by the transistors Q1 and Q4 of the amplifier 3 and the transistors Q3 and Q2 of the amplifier 5, respectively. In this case, the current corresponding to the level of the input signal B for the upper or lower half cycle of the reference level of the audio signal B is supplied from the supply power control circuit 40. For the upper half cycle, current output from the transistor Q1 of the amplifier 3 is sunk through the transistor Q4. For the lower half cycle, the current supplied from the transistor Q3 of the amplifier 5 is sunk through the transistor Q2. By this, the input signal B is power-amplified to provide the output signals C and C' by which the loud speaker 4 is driven. In this case, for the upper half cycle, the voltage difference VD-C between the voltage of the supply power D to the amplifier 3 and the voltage of the output signal C is controlled such that it is maintained at a value of 1 Vf which is near the minimum value necessary to operate the amplifier 3.

Figure 7:
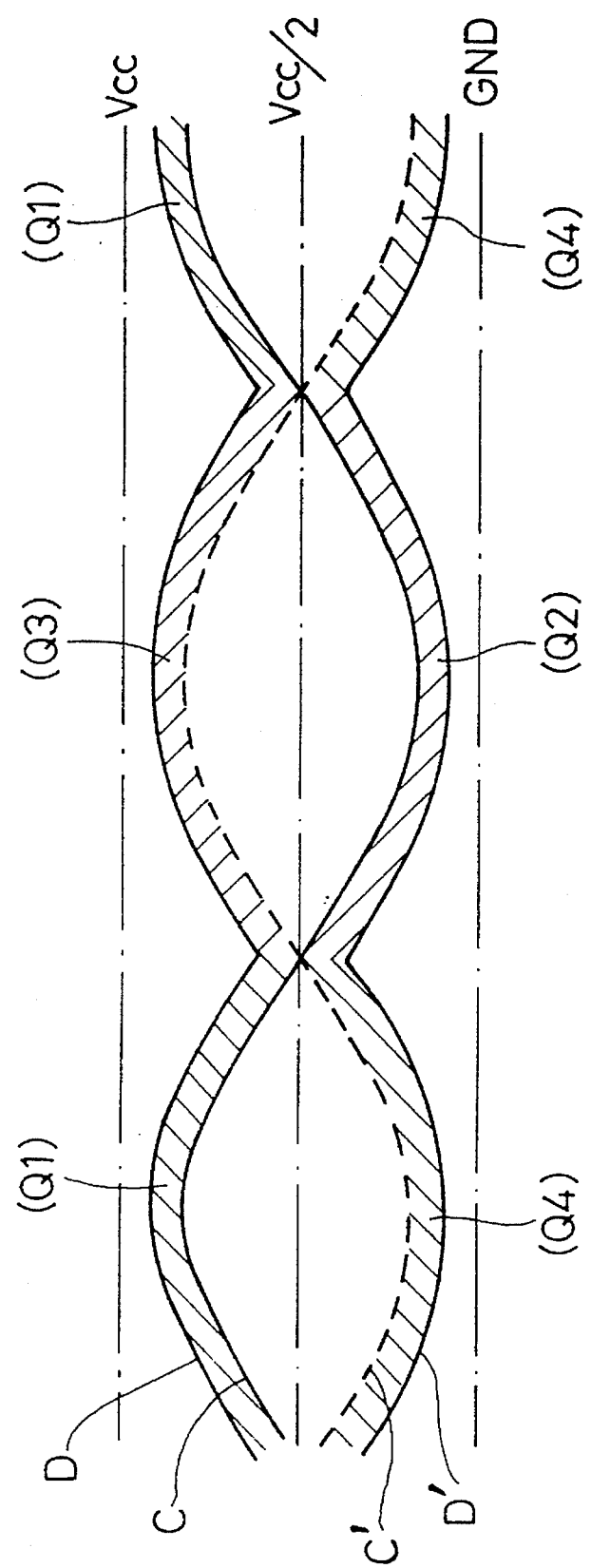
FIG. 7 is an illustration for explanation of power which is consumed in the embodiment shown in FIGS. 1.

As mentioned, power to be circulated to the ground side is similarly controlled by the operation of the supply power control circuit 41. As a result, the power consumption becomes such as shown by hatching portion in FIG. 7 and is reduced compared with the conventional one.

Although power loss due to switching of the power supply line is mainly due to resistance when the transistors Q62 and Q63 are ON as mentioned previously, the power consumption can be restricted practically since the ON resistance value is small. Particularly, since the drive circuit for the PWM control for switching the transistors Q62 and Q63 can be constituted by an IC circuit having a differential amplifier construction, its power consumption can be restricted to a small value compared with the power consumption of the power amplifier stage.

A capacitor 100 connected in parallel to the loud speaker 4 smooths a load current flowing through the loudspeaker 4 by removing frequency component higher than audible frequency and intensifies power for the loudspeaker 4 by storing a portion of commutation current at a time of turning OFF (to be described later). Particularly, it smooths current variation during switching in the supply power control circuits 40 and 41. Therefore, a concrete value of its capacitance is determined according to its relation to an impedance of the loudspeaker 4. Although it is usually about several thousands pF, it is possible to use one having several tens uF in such as amplifier which does not amplify high frequency component, amplifier for low sound only or amplifier which intensifies low sound, etc.

A circular path circuit 101 is composed of flywheel diodes D70, D71, D72 and D73, switching circuits 71 and 72 which selectively connect one of the terminals A and B to the terminals SC and comparators 73 and 74.

The diodes D70 and D71 are connected in series between the terminals SA of the switching circuits 71 and 72 such that their cathode sides become on the side of the switching circuit 71 and a junction Nb therebetween is connected to the output of the amplifier 3. The diodes D72 and D73 are connected in series between the terminals SB of the switching circuits 71 and 72 such that their cathode sides become on the side of the switching circuit 71 and a junction Nc therebetween is connected to the output of the amplifier 5. The terminal SC of the switching circuit 71 is connected to a junction between a coil L70 and the switching transistor Q62 and the terminal SC of the switching circuit 72 is connected to a junction between a coil L70a (see FIG. 3) and the switching transistor Q63.

Here, the diode D70 forms a circular path for feeding current flowing through the coil L70 in a period during which the switching transistor Q62 is in OFF state to the output stage amplifier 5 and the diode D72 forms a circular path for feeding current flowing through the coil L70 in the period during which the switching transistor Q62 is in OFF state to the output stage amplifier 3. Further, the diode D71 forms a circular path for feeding current flowing through the coil L70a in a period during which the switching transistor Q63 is in OFF state through the loudspeaker 4, the capacitor 100 and the transistor Q4 to the coil and the diode D73 forms a circular path for feeding current flowing through the coil L70a in the period during which the switching transistor Q63 is in OFF state through the loudspeaker 4, the capacitor 100 and the transistor Q2 to the coil.

The comparators 73 and 74 supply switching signals to the respective switching circuits 71 and 72 and have reference voltage of Vcc/2 and receives the audio signal. They operate alternately to output pulses having phase difference of 180 degree to the respective switching circuits 71 and 72 as the switching signals. As a result, when the audio signal B is in the upper half cycle, the switching circuits 71 and 72 select the SB and SA terminals, respectively. When the switching transistor Q62 is in OFF state under these conditions, current flowing out from the transistor Q1 returns to the coil L70 through the output terminal of the amplifier 3, the loudspeaker 4, the junction Nc, the diode D72 and the switching circuit 71. When the switching transistor Q62 is ON state, current flowing through the transistor Q4 flows through the coil L70a to the ground. However, if the switching transistor Q63 is in OFF state in this case, the current flows to not the ground but to the coil L70a through the terminal SC of the switching circuit 72, the diode 71, the junction Nb, the output terminal of the amplifier 3, the loudspeaker 4, the output of the amplifier 5 and the transistor Q4. Thus, a circulating circuit including the loudspeaker 4 is formed, so that current flows from the coil L70a to the loudspeaker 4, accumulates on the capacitor 100 and intensifies the output.

The operation of the upper half cycle has been described above. When the audio signal B is in the lower half cycle, the connecting relations of the switching circuits 71 and 72 are reversed. When the switching transistor Q62 is OFF state under this condition, current flowing out from the transistor Q3 returns to the coil L70 through the output terminal of the amplifier 5, the loudspeaker 4, the junction Nb, the diode D70 and the switching circuit 71. When the switching transistor Q62 is in ON state, current flowing through the transistor Q2 flows through the coil L70a to the ground. On the other hand, when the switching transistor Q63 is in OFF state in this case, the current returns to the coil L70a through the terminal SC of the switching circuit 72, the diode 73, the junction Nc, the output terminal of the amplifier 5, the loudspeaker 4, the output of the amplifier 3 and the transistor Q2. Therefore, a circulating circuit including the loudspeaker 4 is formed, so that current flows from the coil L70a to the loudspeaker 4, accumulates on the capacitor 100 and intensifies the output.

The power intensifying with respect to the loudspeaker will be described in more detail. Since, when the switching transistor Q62 is in OFF state, the value of current flowing through the loudspeaker 4 becomes a commutation current, the upper half cycle of the audio signal B will be described for simplicity of explanation, depicting the current flowing through the loudspeaker 4 by I.

It is assumed here that a current $I \times 2/3$ is supplied from the coil L70 through the transistor Q1 to the loudspeaker 4 and is commutated by the diode D72. In this case, a current supplied from the coil L70a to the loudspeaker 4 and commutated by the diode D71 also becomes $I \times 2/3$ and a total current of $I \times 4/3$ flows to the loudspeaker 4 and the capacitor 100. I of the current $I \times 4/3$ flows through the loudspeaker 4 and $I \times 1/3$ flows to the capacitor 100, with which the latter is charged.

When the switching transistors Q62 and Q63 are in ON state, current $I \times 2/3$ is supplied from the coil L70 through the transistor Q1 to which current $I \times 1/3$ stored in the capacitor 100 is added and a total of I is supplied to the loudspeaker 4. Therefore, the current flowing through the loudspeaker 4 is always I regardless of whether the switching transistor Q62 is ON or OFF.

The above matter is also true for the lower half cycle of the audio signal B. Therefore, power to be supplied from the coil L70 to the loudspeaker 4 becomes I even if power to be supplied to the transistors Q1 and Q2 is $I \times 2/3$ and thus a current intensifying effect is obtained.

According to experiments, current flowing through the loudspeaker 4 when current is circulated to the loudspeaker 4 by means of the capacitor and the diodes becomes about 1.5 times that when there is no such elements provided.

Figure 4:
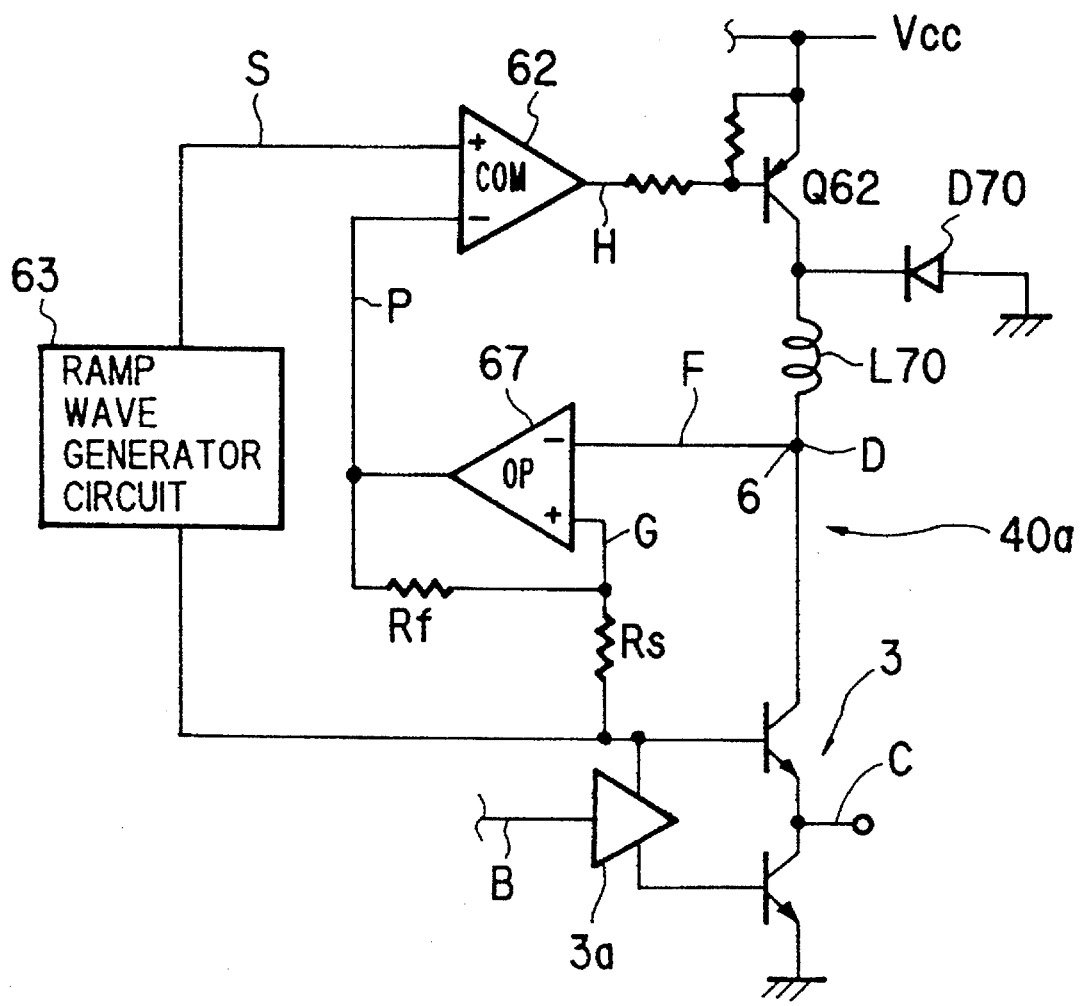
FIG. 4 is a block diagram of, mainly, a supply power control circuit of another embodiment of the present invention when applied to a portable stereo cassette tape player.

FIG. 4 is an embodiment of the supply power control circuit 40a in which one of the voltages to be detected by the detection circuit is changed from the voltage of the output signal C to the voltage of the input signal B.

In FIG. 4, the supply power control circuit 40a performs a control such that the voltages of the output signal C and the supply power D are made constant correspondingly to the voltages of the input signal B and the supply power D.

Same constructive components as those in FIG. 1 are depicted by same reference numerals, respectively. Differences thereof from that shown in FIG. 1 is that a circuit from the detection circuit 50 to the amplifier 61 is replaced by a detection/amplifier circuit 67 constituted by an operational amplifier of inverted amplification type and that the reference signal G is set as a base bias potential of the transistor Q1. Therefore, the ramp wave generator circuit 63 also operates on a reference potential of a base of the transistor Q1.

The detection/amplifier circuit 67 has a (−) input terminal supplied with the voltage of the supply power D and a (+) input terminal supplied with the voltage of the input signal B obtained from the base of the transistor Q1 through a resistor Rs as a reference side potential. That is, the resistor Rs converts a current value of the input signal B into a voltage value. And, a voltage which is substantially constant with respect to the output signal C is generated at the (+) input side terminal of the detection/amplifier circuit 67 of this resistor Rs and thus it plays a role of the diodes D55 and D56 shown in FIG. 1. Further, it includes a feedback resistor Rf connected between an output side thereof and the (+) input terminal. A voltage of an output signal P thereof is sent to a (−) input terminal of the comparator 62 which is a reference input terminal. An output of the ramp wave generator circuit 63 is supplied to the (+) input terminal of the comparator 62. In such circuit, a divided voltage signal F generated from the detection signal and the supply power D are coincident and the reference signal G becomes the same level due to the fact that the input terminal of the operational amplifier is a virtual short.

The difference between the voltages of the output signal and the input signal of the output stage amplifier is caused by a level difference therebetween corresponding to amplification factor of the output stage amplifier and the phase between the input signal and the output signal is the same substantially difference of 180 therebetween. Considering this matter, the same operation as that in the previous embodiment is possible even if the input signal B is put as a detection object.

Figure 5:
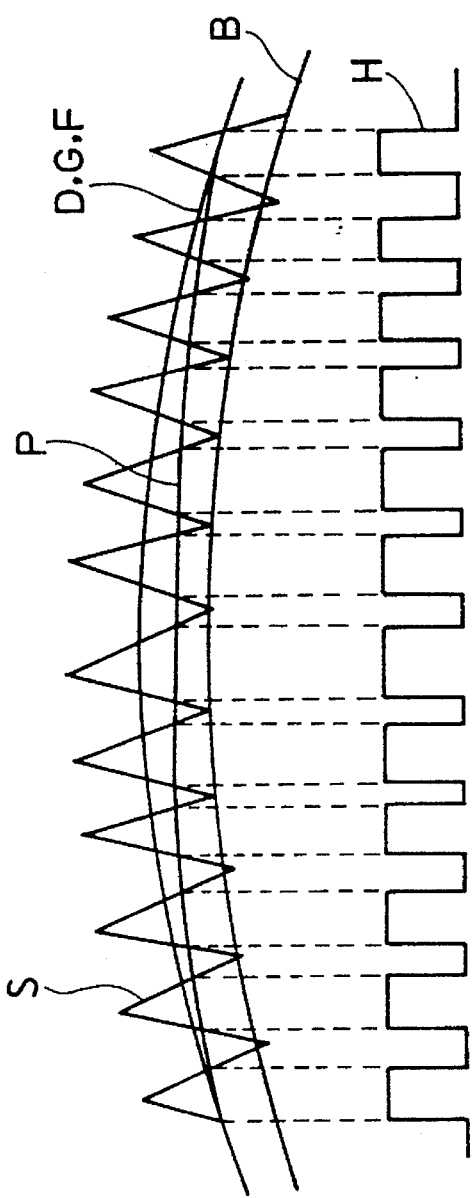
FIG. 5 shows waveforms for explanation of operation of the supply power control circuit in FIG. 4.

Frequency of the ramp signal S is much different from that of the input signal B. FIG. 5 explains the operation thereof theoretically with the frequency of the ramp signal S being low in relation to the input signal B.

Waveforms (see FIG. 5(a)) of the ramp signal S and the reference signal P are obtained correspondingly to the input signal B and PWM pulse corresponding to width of the ramp wave exceeding the reference signal P is supplied to the transistor Q62. As a result, in relation to the output signal C, the PWM control is performed with the waveform relation shown in FIG. 5(b).

Although, in the above mentioned embodiments, the reproduced signal in the tape player has been described as an example, it may be other audio signals such as microphone input or broadcasted signal input, etc. In such case, the signal reproduction processing circuit may be an pre-amplifier to be inserted into an upstream of the output stage amplifier.

Further, although the example in which the amplified signal is sent to the loud speaker has been described, the present invention is not limited thereto. For example, such signal may be used as an input to a recording circuit or to a larger power amplifier.

Although the transistors Q50 and Q55 of the detection circuit 50 are NPN transistors, they may be PNP transistors. In such case, emitters thereof receive the output signal C and bases thereof receive the voltage signal of the supply power D.

If a larger current capacity is required, the by-pass capacitor CN between the output terminal 6 of the supply power D and the ground GND may be replaced by a smoothing capacitor having larger capacity.

Figure 8:
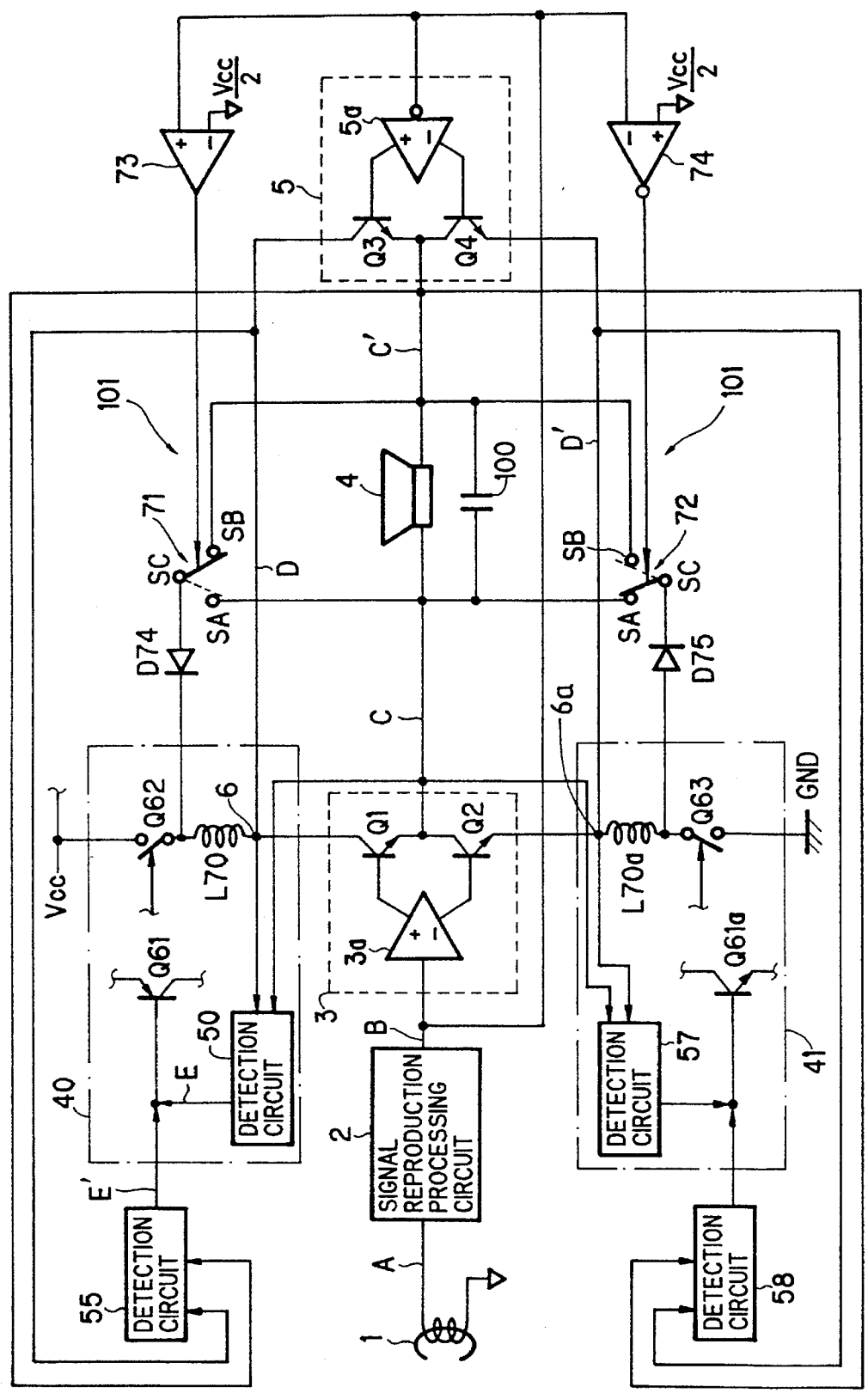
FIG. 8 is an illustration for explanation of another embodiment in which the number of fly-wheel diodes which form a current circulating path in FIG. 1 is reduced.

FIG. 8 shows an embodiment in which the diodes D70, D72, D71 and D73 are removed and, instead thereof, a diode D74 is provided in forward direction on the side of the terminal SC of the switching circuit 71 for commutation current and a diode D75 is provided on the side of the terminal SC of the switching circuit 72 for commutation current. An operation of this embodiment is similar to that of the described embodiment. However, it is possible to reduce power consumption correspondingly to reduction of the number of diodes.

Figure 9:
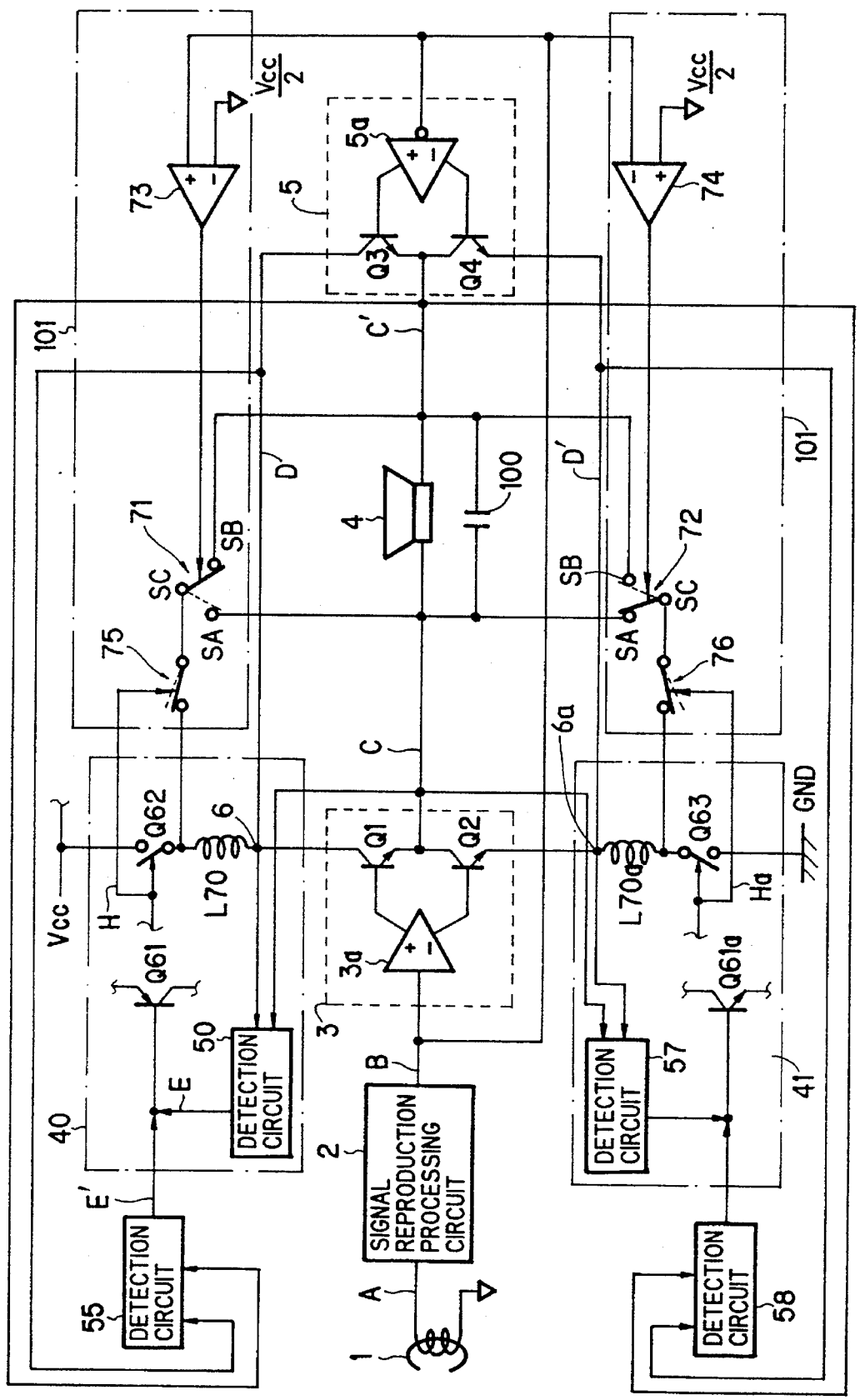
FIG. 9 is an illustration for explanation of another embodiment in which fly-wheel diodes in FIG. 8 are replaced by a switch circuit.

An embodiment shown in FIG. 9 differs from that shown in FIG. 8 in that the diode D74 is replaced by a switching circuit 75 and the diode D75 is replaced by a switching circuit 76.

The switching circuit 75 is turned ON in response to a drive pulse H generated by the comparator 62 to form a commutation path for current of the coil L70. When there is no drive pulse H generated by the comparator, it becomes OFF state. The switching circuit 76 is turned ON in response to a drive pulse Ha generated by the comparator 62a to form a commutation path for current of the coil L70a. When there is no drive pulse Ha generated by the comparator, it becomes OFF state.

An operation of this embodiment is the same as that of the embodiment shown in FIG. 1 and, since voltage drop of the switching circuit is generally smaller than forward voltage drop of a diode, power consumption becomes smaller correspondingly to the fact that the diode is replaced by the switching circuit.

Figure 10:
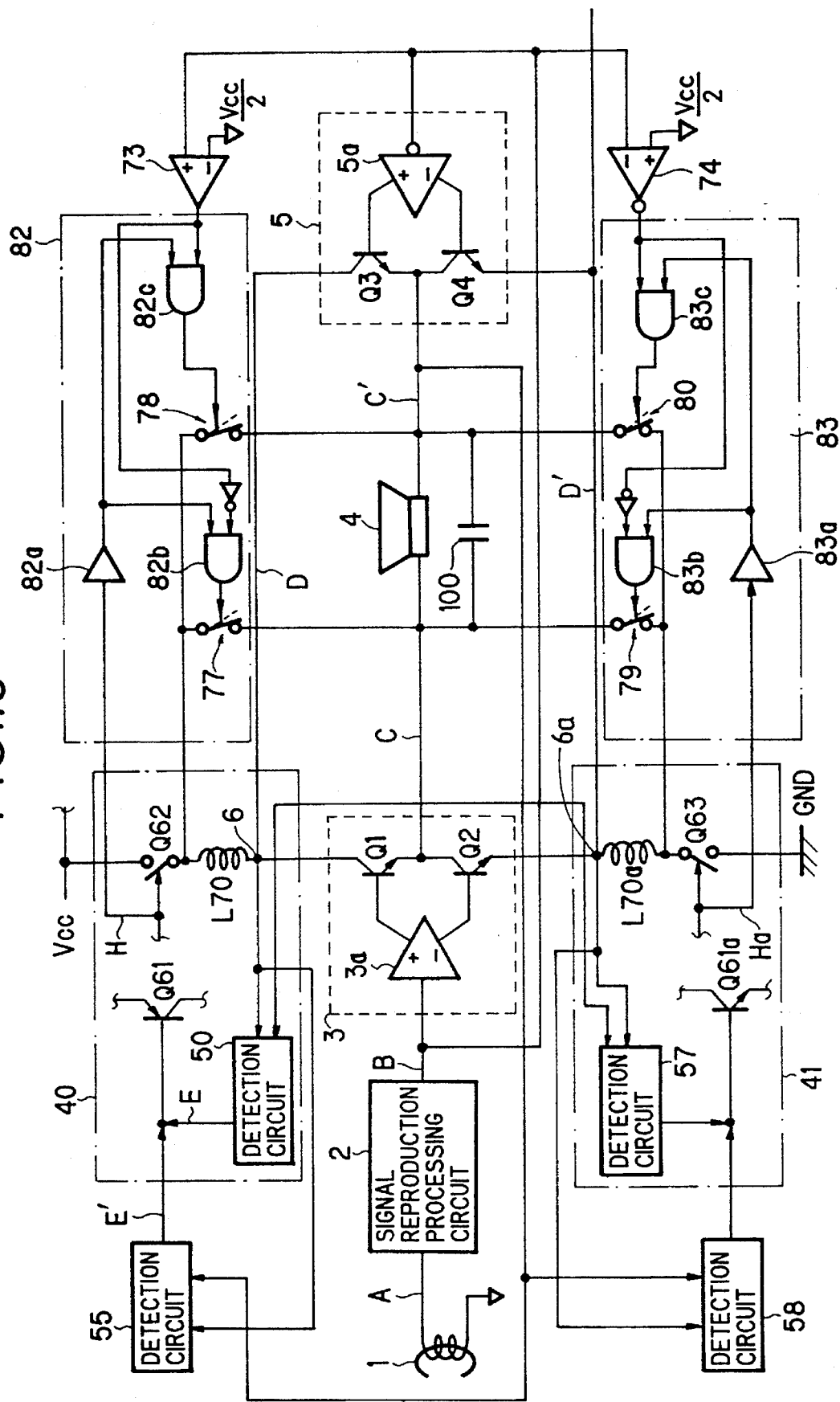
FIG. 10 is an illustration for explanation of another embodiment in which fly-wheel diodes in FIG. 1 are replaced by a switch circuit.

In an embodiment shown in FIG. 10, the diodes D70, D72, D71 and D73 in FIG. 1 are replaced by switching circuits 77, 78 and 79, respectively. With this replacement of elements, the switching circuits 71 and 72 become unnecessary. However, ON/OFF control circuits 82 and 83 are provided in order to form commutation paths for returning currents flowing to the transistors Q1 and Q3 to the coils L70 and L70a by turning the respective switches ON when the switching transistors Q62 and Q63 are in OFF state.

The ON/OFF control circuit 82 is composed of a buffer amplifier 82a which receives the drive pulse H, an AND gate 82b responsive to an output of the buffer amplifier 82a and an inverted output of the comparator 74 to ON/OFF a switch circuit 77 and an AND gate 82c responsive to an output of the buffer amplifier 82a and an output of the comparator 74 to ON/OFF the switching circuit 70.

The ON/OFF control circuit 83 is composed of a buffer amplifier 83a which receives the drive pulse Ha, an AND gate 83b responsive to an output of the buffer amplifier 83a and an inverted output of the comparator 74 to ON/OFF a switch circuit 79 and an AND gate 83c responsive to an output of the buffer amplifier 83a and an output of the comparator 74 to ON/OFF the switching circuit 80.

The switch circuit 77 operates similarly to the switching circuit 75 when the switching circuit 71 shown in FIG. 9 is connected to the SA terminal and the switch circuit 78 operates similarly to the switching circuit 75 when the switching circuit 71 is connected to the SB terminal. The switch circuit 79 operates similarly to the switching circuit 76 when the switching circuit 72 shown in FIG. 9 is connected to the SA terminal and the switch circuit 80 operates similarly to the switching circuit 76 when the switching circuit 72 is connected to the SB terminal. Therefore, the operation of these switch circuits for commutating current is similar to that of the embodiment shown in FIG. 9.

Figure 11:
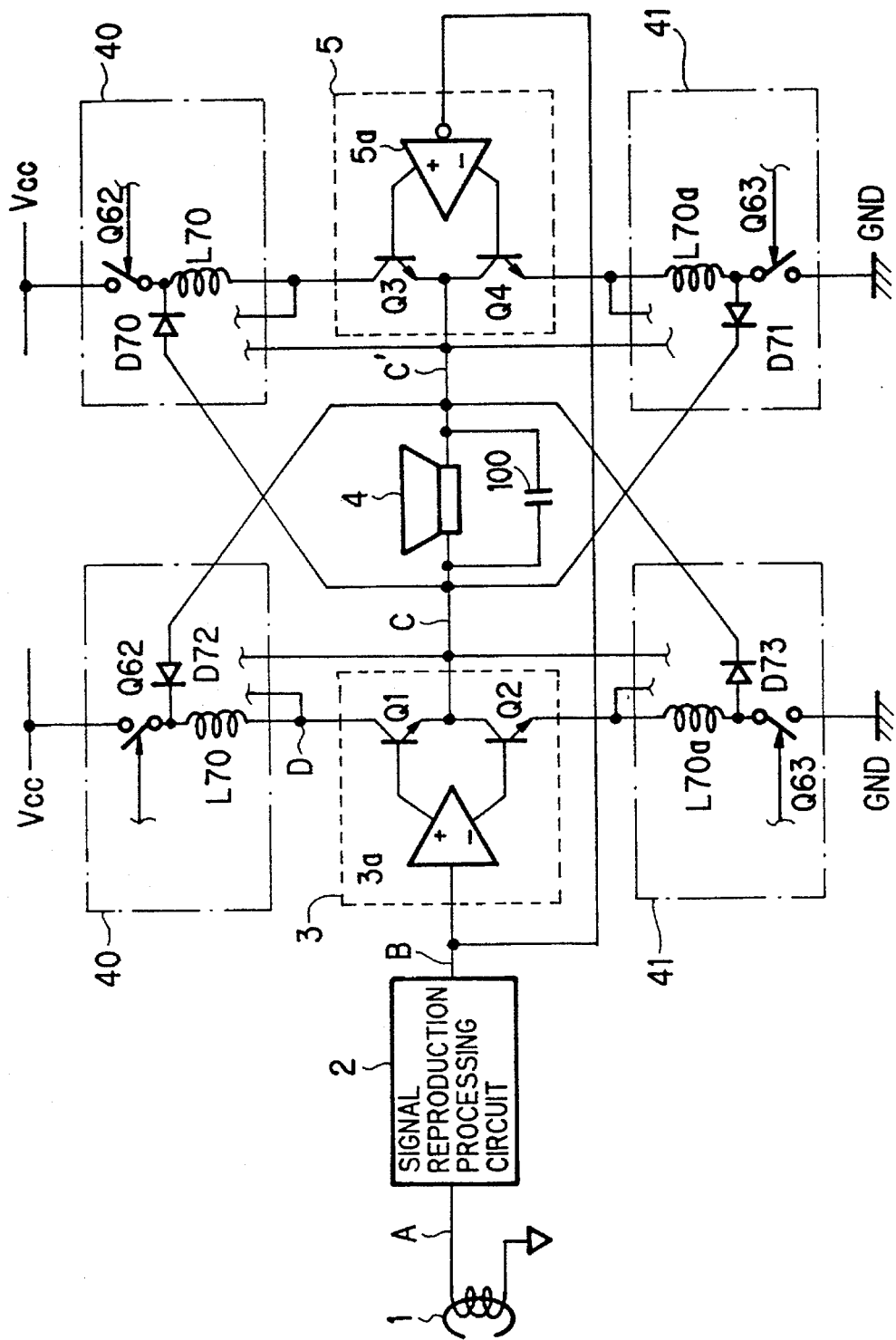
FIG. 11 is a block diagram of another embodiment in which supply power control circuits are provided on both power source side and ground side of respective amplifiers.

FIG. 11 shows an embodiment in which supply power control circuits 40 on the side of the power source are separately provided correspondingly to transistors Q1 and Q3 and supply power control circuits 41 on the side of the power source are separately provided correspondingly to transistors Q2 and Q4. In this case, the ramp wave generator circuits are also provided separately. Since the supply power control circuits are provided separately, respectively, circuits for commutating currents flowing through the coils of respective switching regulators can connect the respective diodes D70, D71, D72 and D73, directly. Its operation is the same as that of the previously mentioned embodiment.

Incidentally, the ramp wave of the ramp wave generator circuit in this embodiment does, of course, include substantially triangular waveforms such as tooth wave and ramp voltage, etc.

What is claimed is:

1. A power amplifier circuit for audio signal comprising:

a first push-pull output stage amplifier for amplifying an audio signal;

a second push-pull output stage amplifier for inverting and amplifying the audio signal;

a switching circuit for switching power from a power source line at a frequency exceeding an audible frequency and feeding one of said first and second output stage amplifiers;

a control circuit for controlling a switching period of said switching circuit such that the power feeding said amplifier is changed correspondingly to the level of the audio signal according to one of a first difference in voltage between one of the audio signal and an amplified audio signal obtained by amplifying the audio signal by said first output stage amplifier and the feeding power and a second difference in voltage between one of the audio signal and an amplified audio signal obtained by amplifying the audio signal by said second output stage amplifier and the feeding power, a loud speaker being driven by outputs of said first and second output stage amplifiers; and a capacitor provided between the outputs of said first and second output stage amplifiers.

2. The power amplifier circuit for audio signal, claimed in claim 1, wherein said capacitor is charged with a portion of current flowing through said loudspeaker when said switching circuit is in an OFF state and discharged to said loudspeaker when said switching circuit is in an ON state, wherein said switching circuit feeds power to one of said first and second output stage amplifiers and wherein the switching period is PWM-controlled such that the voltage difference between the voltage of the output signal of said first output stage amplifier and the voltage of the feeding power becomes substantially constant when the PWM-controlled power is fed to said first output stage amplifier and such that the voltage difference between the voltage of the output signal of said second output stage amplifier and the voltage of the feeding power becomes substantially constant when the PWM-controlled power is fed to said second output stage amplifier.

3. The power amplifier circuit for audio signal claimed in claim 2, wherein said switching circuit comprises a ramp wave generator circuit oscillating at a frequency in a range from 50 kHz to 800 kHz to generate a ramp wave having a reference amplitude level changeable correspondingly to the audio signal, a comparator having one input supplied with an output of said ramp wave generator circuit and the other input supplied with a control signal and a switching transistor for ON/OFF switching power supplied from said power source line correspondingly to an output of said comparator.

4. The power amplifier circuit for audio signal claimed in claim 3, further comprising a coil provided between the output of said switching circuit and a terminal connected to said first and second output stage amplifiers for smoothing said supply power, a first diode provided between the output of said second output stage amplifier and a side of said coil on an output side of said switching circuit for forming a circulating path for feeding said first output stage amplifier with a current flowing through said coil in a period when said switching transistor is in the OFF state and a second diode provided between the output of said first output stage amplifier and the side of said coil on an output side of said switching circuit for forming a circulating path for feeding said second output stage amplifier with a current flowing through said coil in a period when said switching transistor is in OFF state.

5. The power amplifier circuit for audio signal claimed in claim 4, wherein said control circuit comprises a detector circuit including a transistor having an emitter and a base, one of said emitter and base being applied with a voltage signal of the feeding power and the other being applied with a voltage of one of an input signal and an output signal of one of said first and second output stage amplifiers, for generating the detection signal corresponding to a potential difference between said feeding power and said one of said input signal and said output signal and a control voltage value generator circuit for generating the control signal of a predetermined voltage value corresponding to the detection signal and wherein the potential difference is controlled to a constant value which is a minimum value necessary to operate said amplifier as an amplifier.

6. The power amplifier circuit for audio signal claimed in claim 4, wherein said control circuit comprises a detector circuit including a transistor having an emitter and a base, one of said emitter and base being applied with a voltage signal of the feeding power and the other being applied with a voltage of one of an input signal and an output signal of one of said first and second output stage amplifiers, for generating the detection signal corresponding to a potential difference between said feeding power and said one of said input signal and said output signal and a control voltage value generator circuit for generating the control signal of a predetermined voltage value corresponding to the detection signal and wherein the potential difference is controlled to a constant value which is a value larger than but near to a minimum value necessary to operate said amplifier as an amplifier.

7. The power amplifier current for audio signal, claimed in claim 1, wherein said control circuit comprises a control voltage value generator for generating a voltage value corresponding to a difference between said one of said first and second differences and a predetermined voltage value as a control signal and a comparator for comparing the control signal with a certain ramp wave to generate a signal for switching said switching circuit, the control signal controlling said one of said first and second differences such that said one of said first and second differences becomes said predetermined voltage value.

8. A power amplifier circuit for audio signal, comprising:

a first push-pull output stage amplifier for amplifying an audio signal;

a second push-pull output stage amplifier for inverting and amplifying the audio signal;

a first switching circuit for switching power for a power source line at a frequency exceeding audible frequency and feeding one of said first and second output stage amplifiers with the power;

a second switching circuit for switching a ground current flowing from said first or second output stage amplifier to a ground at a frequency exceeding audible frequency and flowing the current to the ground;

a first control circuit for controlling a switching period of said first switching circuit such that the power fed changes correspondingly to a level of the audio signal by comparing a level of a first ramp wave with a comparison level generated correspondingly to one of a first difference in voltage between one of the audio signal and an amplified audio signal produced by amplifying the audio signal by said first output stage amplifier and the power fed and a second difference in voltage between one of the audio signal and an amplified audio signal produced by amplifying the audio signal by said second output stage amplifier and the power fed;

a second control circuit for controlling a switching period of said second switching circuit such that the power circulated to the ground side changes correspondingly to a level of the audio signal by comparing a level of a second ramp wave with a comparison level generated correspondingly to one of a third difference in voltage between one of the audio signal and an amplified audio signal produced by amplifying the audio signal by said first output stage amplifier and the ground current voltage from said first output stage amplifier and a fourth difference in voltage between one of the audio signal and an amplified audio signal produced by amplifying the audio signal by said second output stage amplifier and the ground current voltage from said second output stage amplifier; and a capacitor provided between the outputs of said first and second output stage amplifiers, a loud speaker being driven by outputs of said first and second amplifiers.

9. The power amplifier circuit for audio signal, claimed in claim 8, wherein said capacitor is charged with a portion of current flowing through said loudspeaker when said switching circuit is in OFF state and discharged to said loudspeaker when said switching circuit is in ON state, wherein said first switching circuit comprises a first switching transistor for feeding power to one of said first and second output stage amplifiers and said second switching circuit comprises a second switching transistor for receiving the ground current from said first and second output stage amplifiers, wherein the first switching period is PWM-controlled such that the voltage difference between the voltage of the output signal of said first output stage amplifier and the voltage of the feeding power becomes substantially constant when said first output stage amplifier is to be fed and the second switching period is PWM-controlled such that the voltage difference between the voltage of the output signal of said second output stage amplifier and the voltage of the ground current becomes substantially constant, and wherein the first switching period is PWM-controlled such that the voltage difference between the voltage of the output signal of said second output stage amplifier and the voltage of the feeding power becomes substantially constant when said second output stage amplifier is to be fed and the second switching period is PWM-controlled such that the voltage difference between the voltage of the output signal of said first output stage amplifier and the voltage of the ground current becomes substantially constant.

10. The power amplifier circuit for audio signal, claimed in claim 9, further comprising a first coil provided between the output of said first switching circuit and a terminal connected to said first and second output stage amplifiers for smoothing said supply power, a first diode provided between the output of said second output stage amplifier and a side of said first coil on an output side of said first switching circuit for forming a circulating path for feeding said first output stage amplifier with a current flowing through said first coil in a period when said first switching transistor is in OFF state and a second diode provided between the output of said first output stage amplifier and the side of said first coil on an output side of said first switching circuit for forming a circulating path for feeding said second output stage amplifier with a current flowing through said first coil in a period when said switching transistor is in OFF state, a second coil provided between the input of said second switching circuit and a terminal adapted to flow out the ground current from said first and second output stage amplifiers for smoothing the ground current, a third diode provided between the output of said first output stage amplifier and a side of said second coil on an input side of said second switching circuit for forming a circulating path for feeding a current flowing through said second coil to said loudspeaker in a period during which said second switching transistor is in OFF state and a fourth diode provided between the output of said second output stage amplifier and a side of said second coil on an input side of said second switching circuit for forming a circulating path for feeding a current flowing through said second coil to said loudspeaker.

11. The power amplifier circuit for audio signal, claimed in claim 10, further comprising a ramp wave generator circuit for generating a first and second ramp waves having amplitude reference levels changeable correspondingly to the amplitude of the audio signal and wherein said first and second diodes are connected to the output side of said first switching circuit of said first coil through a first change-over switch circuit for selecting one of said first and second diodes and wherein said third and fourth diodes are connected to the input side of said second switching circuit of said second coil through a second change-over switch circuit for selecting one of said third and fourth diodes, said first and second switch circuits being alternately connected every half cycle of the audio signal.

12. The power amplifier circuit for audio signal, claimed in claim 8, further comprising a first coil provided between the output of said first switching circuit and a terminal connected to said first and second output stage amplifiers, a first switch circuit provided between the output of said second output stage amplifier and a side of said first coil on an output side of said first switching circuit for forming a circulating path for feeding said first output stage amplifier with a current flowing through said first coil in a period when said first switching circuit is in OFF state and a second switch circuit provided between the output of said first output stage amplifier and the side of said first coil on an output side of said first switching circuit for forming a circulating path for feeding said second output stage amplifier with a current flowing through said first coil in a period when said first switching circuit is in OFF state, a second coil provided between the input of said second switching circuit and a terminal adapted to flow out the ground current from said first and second output stage amplifiers, a third switch circuit provided between the output of said first output stage amplifier and a side of said second coil on an input side of said second switching circuit for forming a circulating path for feeding a current flowing through said second coil to said loudspeaker in a period during which said second switching circuit is in OFF state and a fourth switch circuit provided between the output of said second output stage amplifier and a side of said second coil on an input side of said second switching circuit for forming a circulating path for feeding a current flowing through said second coil to said loudspeaker.

13. The power amplifier circuit for audio signal, claimed in claim 8, wherein said first control circuit comprises a first control voltage value generator circuit for generating a voltage value corresponding to a difference between said one of said first and second differences and a certain predetermined voltage value as a first control signal and a first comparator for comparing the first control signal with the level of the first ramp wave for generating a signal for switching said first switching circuit such that said one of the first and second differences becomes the certain predetermined voltage value and said second control circuit comprises a second control voltage value generator circuit for generating a voltage value corresponding to a difference between said one of said third and fourth differences and the certain predetermined voltage value or another predetermined voltage value as a second control signal and a second comparator for comparing the second control signal with the level of the second ramp wave for generating a signal for switching said second switching circuit such that said one of the third and fourth differences becomes the certain predetermined voltage value or the another predetermined voltage value.

14. The power amplifier circuit for audio signal, claimed in claim 13, wherein said predetermined voltage value is 1 Vf or 2 Vf where a forward voltage drop of a diode is 1 Vf.

15. An audio device for amplifying an audio signal and outputting the amplified signal to a load comprising:
    a pre-amplifier circuit for amplifying the audio signal; a first push-pull output stage amplifier for power-amplifying the audio signal amplified by said pre-amplifier and outputting to said load;
    a second push-pull output stage amplifier for power-amplifying the audio signal amplified by said pre-amplifier and outputting to said load;
    a switching circuit for switching power from a power line at a frequency exceeding audible frequency and supplying it to said first and second amplifiers;
    a control circuit for controlling a switching period of said switching circuit such that the supplied power is changed correspondingly to a level of the audio signal correspondingly to one of a first difference in voltage between the supplied power and one of the audio signal voltage and an amplified audio signal produced by amplifying the audio signal by said first amplifier and a second difference in voltage between the supplied power and one of the audio signal voltage and the amplified audio signal produced by amplifying the audio signal by said second amplifier;
    a loudspeaker provided between the outputs of said first and second amplifiers as said load; and
    a capacitor provided between the outputs of said first and second output stage amplifiers.

16. The audio device claimed in claim 15, wherein said control circuit comprises a control voltage value generator for generating a voltage value corresponding to a difference between one of said first and second difference and a predetermined voltage value as a control signal and a comparator for comparing the control signal with a certain ramp wave to generate a signal for switching said switching circuit, the control signal controlling said one of said first and second differences such that said one of said first and second differences becomes said predetermined voltage value.

17. An audio device for amplifying an audio signal and supplying an amplified signal to a load comprising:
    a pre-amplifier for amplifying the audio signal;
    a first push-pull output stage amplifier for amplifying the audio signal amplified by said pre-amplifier and supplying it to said load;
    a second push-pull output stage amplifier for amplifying the audio signal amplified by said pre-amplifier and supplying it to said load;
    a first switching circuit for switching power from a power line at a frequency exceeding audible frequency and feeding it to one of said first and second output stage amplifiers;
    a second switching circuit for switching a ground current flowing from one of said first and second output stage amplifiers to a ground at a frequency exceeding audible frequency and feeding it to the ground;
    a first control circuit for controlling a switching period of said first switching circuit such that the feeding power is changed correspondingly to a level of the audio signal correspondingly to one of a first difference in voltage between the feeding power voltage and one of the audio signal voltage and the audio signal amplified by said first output stage amplifier and a second difference in voltage between the feeding power voltage and one of the audio signal voltage and the audio signal amplified by said second amplifier;
    a second control circuit for controlling a switching period of said second switching circuit such that the power flowing to the ground is charged corresponding to a level of the audio signal correspondingly to one of a third difference in voltage between the ground current voltage from said first output stage amplifier and one of the audio signal voltage and the audio signal amplified by said first output stage amplifier and a fourth difference in voltage between the ground current voltage and one of the audio signal voltage and the audio signal amplified by said second amplifier;
    a loud speaker provided between the outputs of said first and second amplifiers as said load; and
    a capacitor provided between the outputs of said first and second amplifiers.

\* \* \* \* \*